United States Patent

Strzyzewski

(10) Patent No.: US 6,908,838 B2
(45) Date of Patent: Jun. 21, 2005

(54) METHOD AND DEVICE FOR TREATING SEMICONDUCTOR SUBSTRATES

(75) Inventor: Piotr Strzyzewski, Herzogenrath (DE)

(73) Assignee: Aixtron AG (DE)

(*) Notice: Subject to any disclaimer, the term of this patent is extended or adjusted under 35 U.S.C. 154(b) by 0 days.

(21) Appl. No.: 10/601,508

(22) Filed: Jun. 23, 2003

(65) Prior Publication Data

US 2004/0058464 A1 Mar. 25, 2004

Related U.S. Application Data

(63) Continuation of application No. PCT/EP01/14832, filed on Dec. 15, 2001.

(30) Foreign Application Priority Data

Dec. 23, 2000 (DE) .......................... 100 64 943
Dec. 5, 2001 (DE) .......................... 101 59 702

(51) Int. Cl.$^7$ ............................... H01L 21/20
(52) U.S. Cl. ..................................... 438/584
(58) Field of Search ................. 438/795, 767, 438/718, 716, 711, 709, 689, 584, 478, 5, 680, 679, 627; 257/679

(56) References Cited

U.S. PATENT DOCUMENTS

| | | | |
|---|---|---|---|
| 4,985,281 A | | 1/1991 | Ahlgren .................. 427/248.1 |
| 5,135,608 A | * | 8/1992 | Okutani ....................... 438/584 |
| 6,077,321 A | | 6/2000 | Adachi et al. .............. 29/25.01 |
| 6,328,864 B1 | | 12/2001 | Ishizawa ................. 204/298.01 |
| 6,376,387 B2 | * | 4/2002 | Carlson et al. ............. 438/716 |
| 6,503,831 B2 | * | 1/2003 | Speakman .................. 438/674 |

FOREIGN PATENT DOCUMENTS

| | | |
|---|---|---|
| EP | 0209150 | 1/1987 |
| JP | 3193877 | 8/1993 |
| JP | 5259098 | 10/1993 |
| JP | 7058093 | 3/1995 |
| JP | 10303279 | 11/1998 |

* cited by examiner

Primary Examiner—Craig A. Thompson
Assistant Examiner—Monica D. Harrison
(74) Attorney, Agent, or Firm—St. Onge Steward Johnston & Reens LLC

(57) ABSTRACT

The invention relates to a method and to a device for treating semiconductor substrates. In conventional systems, the especially uncoated semiconductor substrates are fed to a treatment device through a charging sluice, said charging sluice adjoining a transfer chamber. A plurality of treatment chambers can be charged with the semiconductor substrates to be treated from said transfer chamber by first evacuating the transfer chamber and the treatment chamber and then opening the connecting door between the transfer chamber and the treatment chamber. The aim of the invention is to improve this system. To this end, at least one of the treatment chambers is operated at a low pressure or atmospheric pressure and the transfer chamber is flooded with an inert gas before the connecting door associated with the treatment chamber is opened, while a predetermined pressure difference between the transfer chamber and the treatment chamber is maintained.

14 Claims, 3 Drawing Sheets

METHOD AND DEVICE FOR TREATING SEMICONDUCTOR SUBSTRATES

This application is a continuation of pending International Patent Application No. PCT/EP01/14832 filed Dec. 15, 2001, which designates the United States and claims priority of pending German Application Nos. 10064943 filed Dec. 23, 2000 and 10159702 filed Dec. 5, 2001.

FIELD OF THE INVENTION

The invention relates to a method and device for treating semiconductor substrates, in which the in particular uncoated semiconductor substrates are fed through a loading lock to a treatment arrangement, which loading lock adjoins a transfer chamber from which, in turn, a multiplicity of treatment chambers can be loaded with the semiconductor substrates which are to be treated, for which purpose, first of all, the transfer chamber and the treatment chamber are evacuated, and then a connecting door between transfer chamber and treatment chamber is opened.

In the prior art, in particular in silicon technology, linked semiconductor processes are carried out in what are known as multichamber installations (cluster tools). A specific treatment step on the semiconductor substrate is carried out in each of the plurality of chambers. Inter alia, coating steps, etching steps, conditioning steps, diffusion steps and the like can be carried out therein. The substrate is moved from one treatment chamber to another by means of at least one robot arm disposed in a transfer chamber. The treatment chambers are separated from the transfer chamber by means of a pressure-tight and gastight connecting door. This is only opened after both the transfer chamber and the corresponding treatment chamber have been evacuated. In the case of treatment processes which take place in a vacuum or an ultrahigh vacuum, only the transfer chamber has to be evacuated or held under a vacuum. In the case of processes which take place at atmospheric pressure or low pressure, the treatment chamber has to be evacuated. This evacuation step is disadvantageous in particular if a coating process is carried out in the treatment chamber. In CVD processes of this type, parasitic deposition, for example on the walls of the process chamber, is often impossible to avoid. The thermal and mechanical loads associated with the evacuation can lead to the parasitic coatings flaking off. The associated formation of particles causes problems. The particles may in particular pass into the transfer chamber or adversely affect the substrate/layer surface. Furthermore, dynamic pressure processes of this nature influence the thermal profile within the process chamber, which should preferably be held at process temperature or only cooled slightly during the loading and unloading. Particularly in the case of process pressures of greater than one millibar, the heat conduction effects are influenced to a considerable extent by the evacuation. The result of this is that the cycle times are high on account of the time required to achieve equilibrium conditions.

The invention is based on the object of providing measures for counteracting the abovementioned drawbacks and in particular of integrating a CVD reactor, preferably an MOCVD reactor, in a multichamber installation.

The object is achieved by means of the invention specified in the claims, in which it is first of all and substantially provided that a low-pressure or atmospheric-pressure process is operated in at least one of the treatment chambers, and the transfer chamber is flooded with an inert gas before the connecting door associated with this treatment chamber is opened. The result of this measure is that the treatment chamber can be held at process pressure. The process gases are simply switched off. In a refinement of the invention, it is provided that, when the connecting door is opened, the pressure in the transfer chamber is slightly higher than the pressure in the treatment chamber. The result of this is that a gas flow direction is directed through the connecting door into the treatment chamber. This prevents residual gases from escaping from the treatment chamber into the transfer chamber. Therefore, mass transfer in this direction can take place substantially only by diffusion. Therefore, cross-contamination between the gases in adjacent treatment chambers is also prevented. In a refinement of the invention, it is provided that the low-pressure or atmospheric-pressure treatment chamber has a heated process chamber which remains heated and in particular is kept at process temperature during the loading or unloading. If the treatment chamber is an MOCVD reactor in which phosphorus-containing semiconductor layers are deposited on in particular a III-V substrate, it is possible to provide for the process chamber temperature to be lowered for the loading and unloading, in order to prevent the phosphorus component from evaporating out of the semiconductor layer which has been deposited. To carry out the MOCVD process, corresponding reaction gases are fed to the gas phase. Arsine or phosphine are used for elements of the fifth main group. The corresponding metal organic compounds of Ga, In or Al are used for the elements of the third main group.

The invention also relates to a device or a method in which only one or more low-pressure or atmospheric-pressure treatment chambers are associated with a transfer chamber. In order in particular with devices of this type to ensure a defined gas flow from the transfer chamber into the treatment chamber with the connecting door open, the invention provides for both the purge gas flow into the transfer chamber and the purge gas flow into the treatment chamber to be fixed before the connecting door is opened and while the connecting door is open. As a result, a constant gas stream always flows into both the transfer chamber and the treatment chamber. The gas stream which flows from the transfer chamber into the treatment chamber is predetermined by the pressure difference between the transfer chamber and the treatment chamber. The pressure in the treatment chamber is set by means of a controllable valve which influences the evacuation power of the associated pump. The pressure in the transfer chamber is likewise controlled by means of a valve, which influences the evacuation power of the pump associated with the transfer chamber.

The invention relates in particular to the control method by means of which this pressure balance can be set. According to the invention, either the pressure of the transfer chamber or the pressure of the treatment chamber is predetermined. Furthermore, the purge gas flow flowing into this chamber is predetermined. The purge gas flow is dependent on the total pressure inside the chamber. If the total pressure is low, a small purge gas stream flows. If the total pressure is higher, a correspondingly higher purge gas stream flows. The second predetermined parameter is the pressure difference with respect to the other chamber. This pressure difference may be dependent on the total pressure. The process control element, which may be a computer, determines the pressure in the other chamber from the two parameters. The purge gas flow which is to be set for this chamber is determined as a function of this pressure. Then, the purge gas flow and the pressure are set. If stable pressure conditions have been established in both the treatment chamber and the transfer chamber, the connecting door is opened. It is preferable for the pressure in the treatment chamber to be predetermined, so that the transfer chamber pressure is set according to the pressure difference and the treatment chamber pressure. The pressure difference between transfer chamber pressure and treatment chamber pressure may be between 0.1 and 5 mbar. The pressure in the transfer chamber and/or the pressure in the treatment chamber may be between 1 and a few 100 mbar. Accordingly, the purge gas flow into the transfer chamber and/or the treatment chamber is between 100 and 500 sccm. The flow may also be greater in the treatment chamber.

BRIEF DESCRIPTION OF THE DRAWINGS

Exemplary embodiments of the invention are explained below with reference to the accompanying drawings, in which.

DETAILED DESCRIPTION OF THE DRAWINGS

Figure 1:
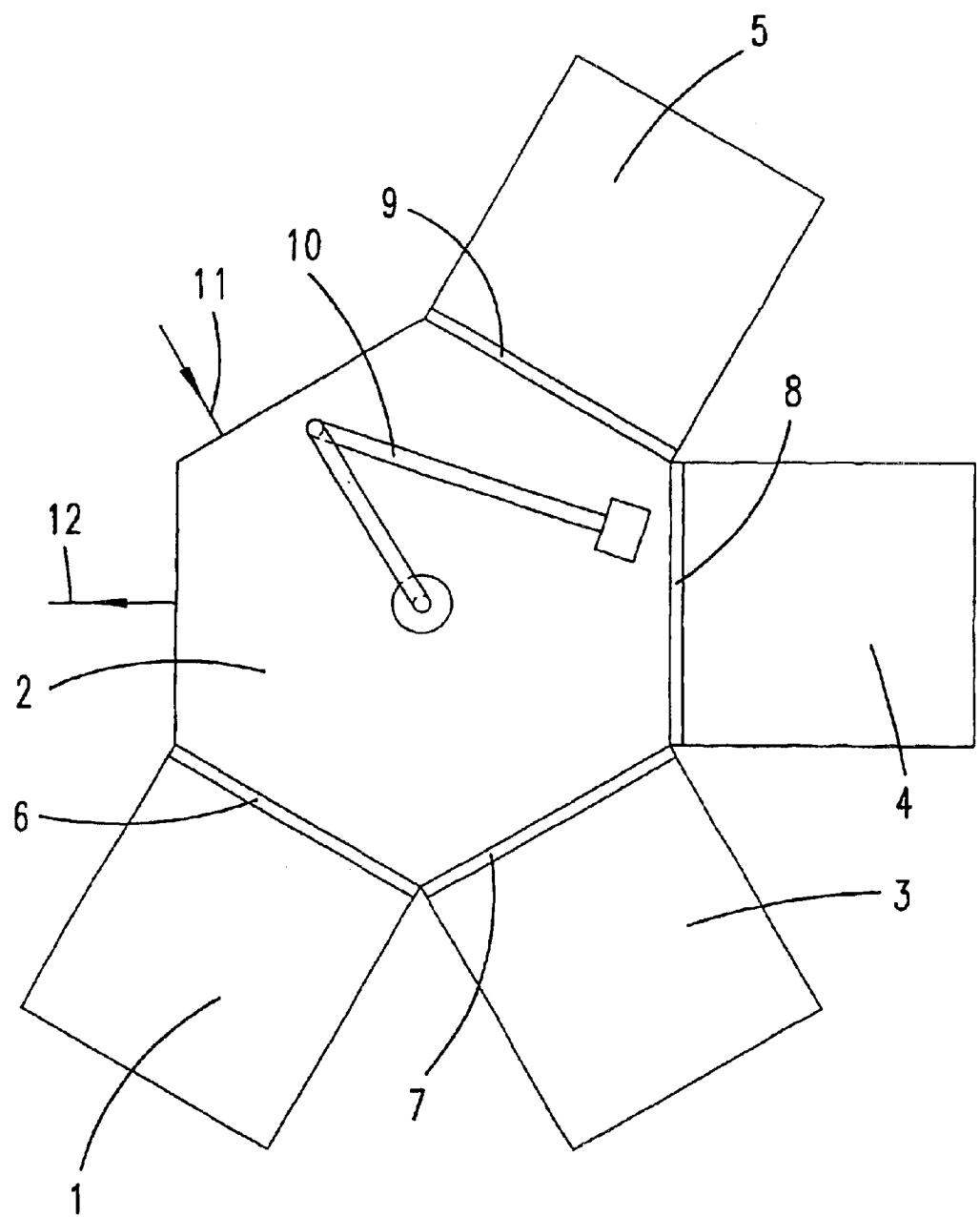
FIG. 1 shows, in highly diagrammatic illustration, a device for treating semiconductor substrates.

The device illustrated in FIG. 1 has as its central element a transfer chamber 2. In the transfer chamber 2 there is a robot arm 10. The transfer chamber 2 is loaded by means of a loading lock 1. The semiconductor substrates (wafers), in particular in magazines, are introduced into this loading lock 1. These wafers may be uncoated. However, they may also have been pretreated. The loading lock 1 is separated from the transfer chamber 2 by means of a connecting door 6 in the form of a gastight and pressure-tight partition. In the exemplary embodiment, the transfer chamber 2 is adjoined by the treatment chambers 3, 4 and 5, which are in each case connected to the transfer chamber 2 via an openable connecting door 7, 8, 9. A purge line 11 for flooding the transfer chamber 2 with an inert gas, for example hydrogen, nitrogen or argon, opens out into the transfer chamber 2. Furthermore, an evacuation line 12, which leads to a vacuum pump, leads from the transfer chamber 2.

The treatment chamber 3 may be an ultrahigh vacuum chamber in which, by way of example, an RTP (rapid thermal processing) process is carried out at a pressure of $10^{-6}$ mbar. An MOCVD process may take place in the treatment chamber 4. This process may take place at process pressures of greater than 1 mbar. Either a vacuum process or a low-pressure process or an atmospheric-pressure process may be carried out in the treatment chamber 5.

To move the substrates, which may be disk-like wafers which, depending on the process, may consist of silicon, gallium arsenide or indium phosphide, from one of the treatment chambers 3 to 5 into another treatment chamber or from or to the loading lock 1, the transfer chamber 2 has a robot arm 10 which can pass through the opened connecting doors 7 to 9 into a respective treatment chamber 3 to 5. To load the UHV treatment chamber 3 with substrates or to unload the chamber 3, first of all the transfer chamber 2 is evacuated, for which purpose the inert gas feed line 11 is blocked off and the line 12 leading to a vacuum pump is opened. After a sufficiently high vacuum has been reached in the transfer chamber 2, the connecting door 7 is opened and the loading or unloading operation can commence. The substrates which have been removed from the UHV treatment chamber 3 can be temporarily stored in the transfer chamber 2 or alternatively in the loading lock 1. Then, the connecting door 7 is closed again. To load or unload the low-pressure or atmospheric-pressure treatment chamber 4, the transfer chamber 2 is flooded with an inert gas, for example argon or nitrogen, or optionally also hydrogen, via the inert gas feed line 11, until a pressure which is slightly higher than the pressure in the low-pressure or atmospheric-pressure process chamber 4 has built up in the transfer chamber 2. During the flooding and the loading and unloading, the transfer chamber is purged with inert gas, for example nitrogen or argon. When this slight excess pressure is reached, the associated connecting door 8 is opened. The excess pressure is selected to be so slight that only a defined flow from the transfer chamber 2 into the low-pressure or atmospheric-pressure treatment chamber is established.

An MOCVD process can be carried out in the low-pressure or atmospheric-pressure treatment chamber 4. For this purpose, this treatment chamber 4 has a process chamber which is known in the prior art and to which the required process gases are fed. The process chamber is heated. During the loading and unloading, the process chamber can be held at process temperature. Only after phosphorus-containing layers have been deposited may it possibly be necessary for the process chamber temperature to be reduced slightly, in order to prevent phosphorus from evaporating out of the surface.

The pressure difference between transfer chamber 2 and treatment chamber 4 is selected in such a way that a defined direction of flow from transfer chamber to process chamber is established. However, the gas flow is not sufficiently high to bring about significant cooling effects or flow-related detachment of particles from the walls. The defining of the direction of flow substantially serves to prevent contamination of the transfer chamber 2 during the transfer.

Substrates which have been pretreated in other treatment chambers 3, 5 can be coated in the treatment chamber 4 which is formed by an MOCVD reactor. Furthermore, it is possible for the substrates which have been coated in the treatment chamber 4 to undergo an after treatment in one of the other treatment chambers 3, 5, for example to be heat-treated in ultra-high vacuum or else at low pressure or atmospheric pressure. Only a total of three treatment chambers 3, 4, 5 are illustrated in the exemplary embodiment. However, the invention also comprises multichamber installations with significantly greater numbers of linked treatment chambers.

Figure 2:
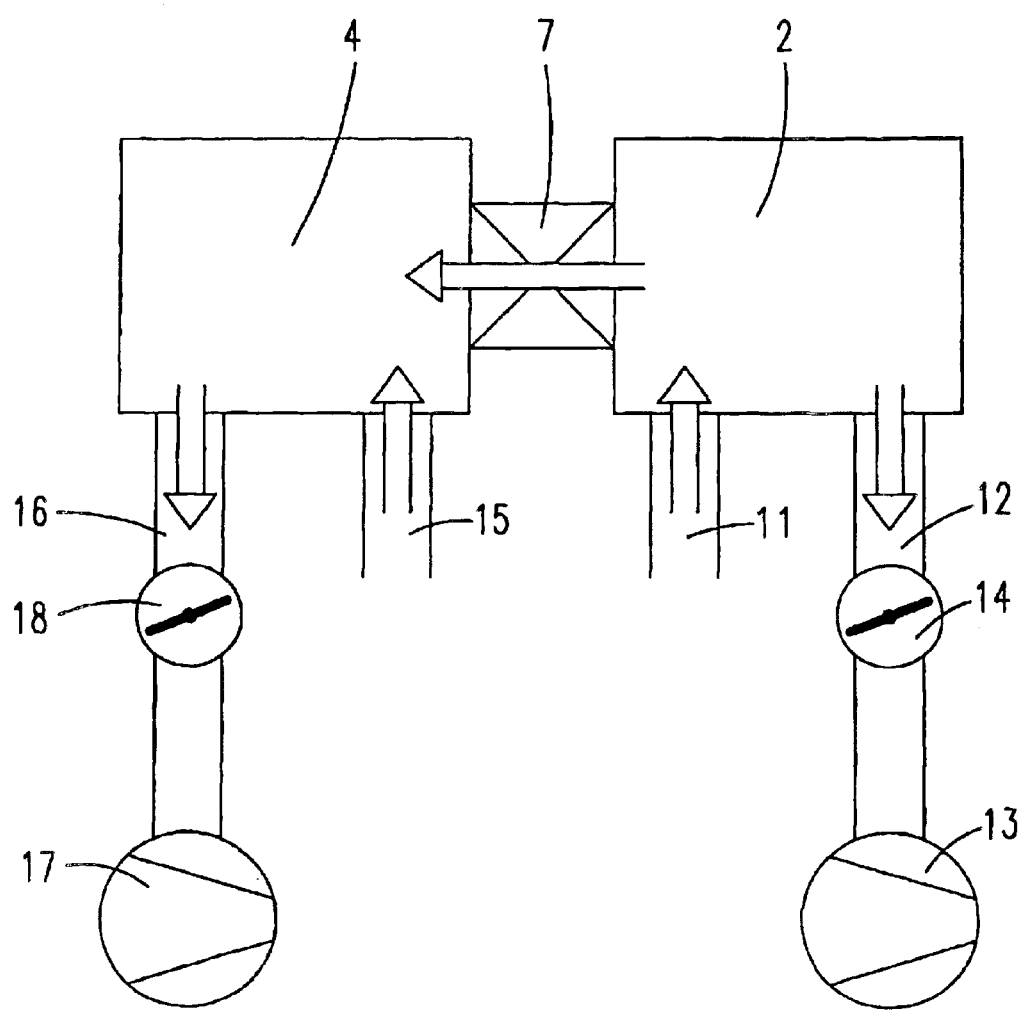
FIG. 2 shows, highly diagrammatically, a section through a transfer chamber and a treatment chamber, with gas flows indicated.

FIG. 2 presents a highly diagrammatic illustration of an arrangement which includes a transfer chamber 2 and a treatment chamber 4 which are separated from one another by means of a partition 7. The partition 7 can be opened. An inert gas feed line 11 and an evacuation line 12 open out into the transfer chamber 2. In the evacuation line 12 there is a pressure-regulating valve 14 which is connected upstream of a vacuum pump 13.

The treatment chamber is of virtually identical construction. An inert gas feed line 15 and an evacuation line 16 likewise open out into the treatment chamber 4. This evacuation line 16 also has a pressure-regulating valve 18 which is disposed upstream of a vacuum pump 17.

Figure 3:
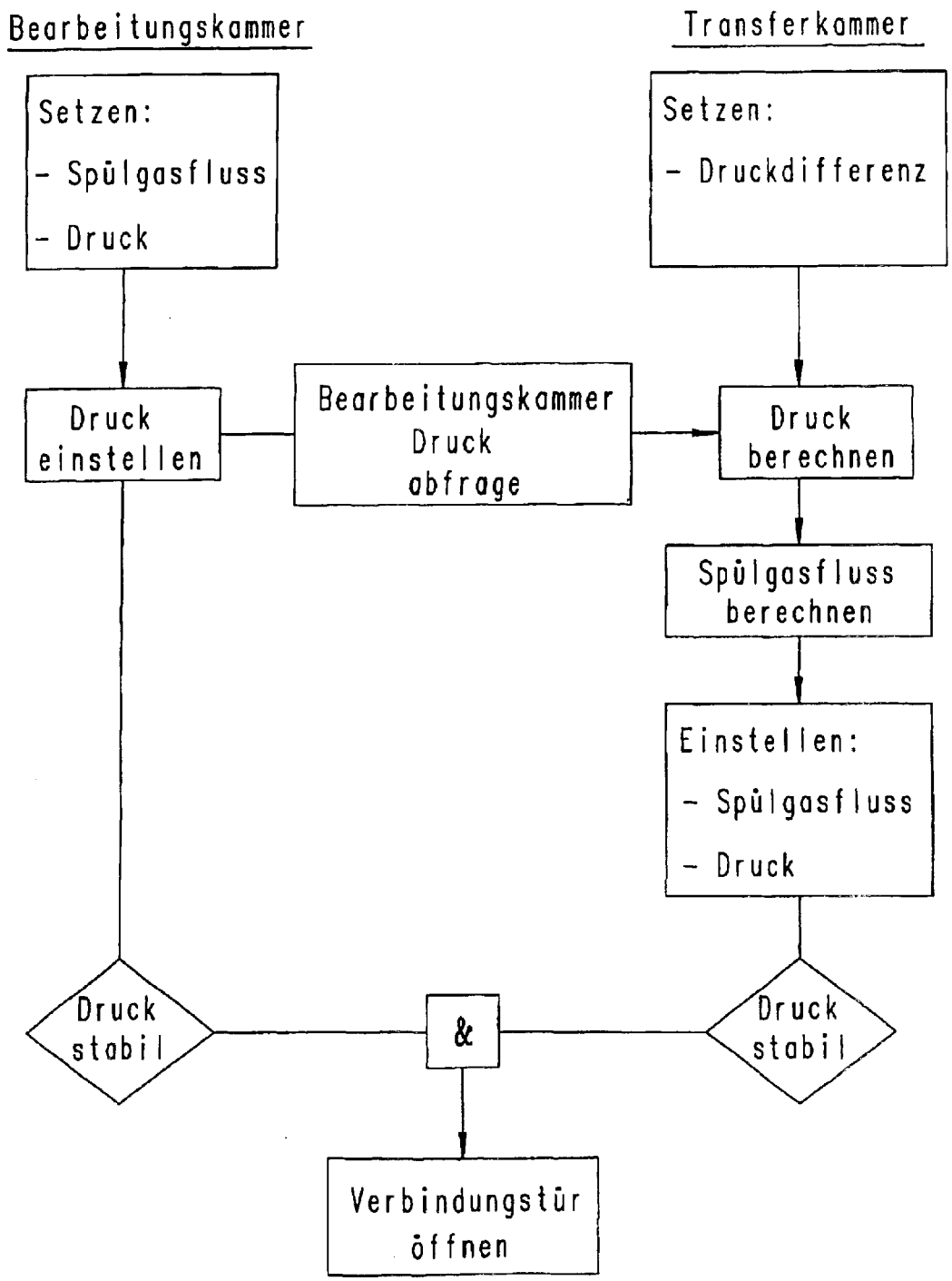
FIG. 3 shows the flowchart for the pressure control in the transfer chamber.

Before the connecting door 7 between the transfer chamber 2 and the treatment chamber 4 is opened, a pressure which is slightly higher than the pressure in the treatment chamber 4 is built up in the transfer chamber 2. The pressure in the transfer chamber 2 is preferably about 1 to 5 mbar higher than the pressure in the treatment chamber 3. The pressure-aligning process illustrated in FIG. 3 takes place in the following way:

The purge gas flow through the inert gas feed line 15 is set to a fixed, predetermined value. This value may be between 1 and 500 sccm. Furthermore, the pressure in the treatment chamber 4 is predetermined. The pressure-regulating valve 18 regulates the evacuation power of the pump 17 according to the stipulated pressure.

The process control element uses the predetermined pressure in the treatment chamber 4 and the predetermined pressure difference to determine the pressure in the transfer chamber 2. The control element, as a function of the transfer chamber pressure, fixes the inert gas stream flowing through the feed line 11 on the basis of a predetermined table of values or a predetermined functional relationship. The constant gas flow is in this case too 100 to 500 sccm.

With the gas stream remaining constant, the pressure is regulated by means of the pressure-regulating valve 14, which influences the evacuation power of the pump 13.

As soon as the pressure in the treatment chamber 4 and the pressure in the transfer chamber 2 have adopted a stable value, the connecting door 7 opens. As a result of the pressure difference in the treatment chamber 4 and the transfer chamber 2, a gas stream passes through the open connecting door 7. The gas stream passing through the open connecting door 7 is selected to be sufficiently low for no particles to be removed from the walls of the treatment chamber 4. However, it is sufficiently great to as far as possible prevent cross-contamination.

When the door 7 is open, the pressures in the treatment chamber and the transfer chamber are regulated by means of the evacuation power of the pumps associated with the chambers.

As can be seen from FIG. 2, the feed lines 11, 15 are closer to the connecting door 7 than the gas discharge lines 12 and 16, which are at a greater distance from the connecting door 7.

All features disclosed are (inherently) pertinent to the invention. The disclosure content of the associated/appended priority documents (copy of the prior application) is hereby incorporated in its entirety in the disclosure of the application, partly with a view to incorporating features of these documents in claims of the present application.

What is claimed is:

1. Method for treating semiconductor substrates, in which the in particular uncoated semiconductor substrates are fed through a loading lock to a treatment arrangement, which loading lock adjoins a transfer chamber from which, in turn, a multiplicity of treatment chambers can be loaded with the semiconductor substrates which are to be treated, for which purpose, first of all, the transfer chamber and the treatment chamber are evacuated, and then a connecting door between transfer chamber and treatment chamber is opened, in which method a low-pressure or atmospheric-pressure process is operated in at least one of the treatment chambers, and the transfer chamber is flooded with an inert gas before the connecting door associated with this treatment chamber is opened, both the treatment chamber and the transfer chamber, before the connecting door is opened, being purged, in each case at a predefined pressure, with a respective purge gas which remains constant, in such a manner that, when the connecting door is opened, a gas stream flows from the transfer chamber into the treatment chamber and is maintained during loading of the treatment chamber through the fact that the pressure in the transfer chamber is slightly higher than the pressure in the treatment chamber.

2. Method according to claim 1, characterized in that the pressure difference is regulated by varying the evacuation power.

3. Method according to claim 1, characterized in that the low-pressure or atmospheric-pressure treatment chamber has a heated process chamber which remains heated, and in particular is kept at process temperature, during the loading or unloading.

4. Method according to claim 1, characterized in that coating of the semiconductor substrates is carried out in the low-pressure or atmospheric-pressure treatment chamber in particular by means of reaction gases fed to the gas phase.

5. Method according to claim 1, characterized in that an MOCVD process is carried out in the low-pressure or atmospheric-pressure treatment chamber.

6. Method for treating semiconductor substrates, in which the in particular uncoated semiconductor substrates are fed through a loading lock to a treatment arrangement, which loading lock adjoins a transfer chamber from which one or more treatment chambers can be loaded with the semiconductor substrates which are to be treated, for which purpose a connecting door between transfer chamber and treatment chamber is opened, characterized in that a low-pressure or atmospheric-pressure process is operated in at least one of the treatment chambers, and the transfer chamber is flooded with an inert gas before the connecting door associated with this treatment chamber is opened, the pressure difference between the transfer chamber and the treatment chamber being maintained through the fact that, with the gas flows into the transfer chamber, on the one hand, and into the treatment chamber, on the other hand, remaining constant, the pressure in transfer chamber and/or treatment chamber is controlled by varying the evacuation power.

7. Method according to claim 6, characterized in that, before the connecting door is opened, a stable pressure is in each case set in the transfer chamber and the treatment chamber, the pressure in the transfer chamber being higher than the pressure in the treatment chamber by a pressure difference.

8. Method according to claim 6, characterized in that the pressure difference is approximately 0.1 to 5 mbar.

9. Method according to claim 6, characterized in that the level of the purge gas flow in the treatment chamber and/or the transfer chamber increases according to the total pressure in the corresponding chamber and follows a predetermined functional relationship or is stored in a table of values in an electronic control unit.

10. Device for carrying out the method according to claim 6, having a loading lock which adjoins a transfer chamber, in particular a transfer chamber which can be evacuated, and having at least one treatment chamber for treatment of a semiconductor substrate, characterized in that at least one treatment chamber is configured so as to treat semiconductor substrates at low pressure or atmospheric pressure, it being possible for the transfer chamber for loading these chambers to be purged with an inert gas at the corresponding location (s), in that during loading a gas stream flows into the treatment chamber as a result of a pressure difference.

11. Device according to claim 10, characterized in that the low-pressure or atmospheric-pressure treatment chamber is an MOCVD reactor with a heatable process chamber.

12. Device according to claim 11, characterized by a control element for setting respective purge gas flows into both the treatment chamber and the transfer chamber and for regulating the pressures in the treatment chamber and the transfer chamber.

13. Device according to claim 12, characterized by an evacuation means associated with in each case one treatment chamber and an evacuation means associated with the transfer chamber, which evacuation means are controlled by the control element.

14. Device according to claim 13, characterized in that the purge gas outlet is closer to the connecting door than the gas outlet line associated with the evacuation means.

* * * * *